United States Patent
Yeom et al.

(10) Patent No.: US 8,293,069 B2
(45) Date of Patent: *Oct. 23, 2012

(54) INDUCTIVELY COUPLED PLASMA APPARATUS

(75) Inventors: Geun-Young Yeom, Seoul (KR); Kyong-Nam Kim, Daejeon (KR); Seung-Jae Jung, Gyeonggi (KR)

(73) Assignee: Sungkyunkwan University, Seoul (KR)

( * ) Notice: Subject to any disclaimer, the term of this patent is extended or adjusted under 35 U.S.C. 154(b) by 699 days.

This patent is subject to a terminal disclaimer.

(21) Appl. No.: 12/331,981

(22) Filed: Dec. 10, 2008

(65) Prior Publication Data

US 2009/0133840 A1 May 28, 2009

Related U.S. Application Data

(63) Continuation-in-part of application No. 10/914,167, filed on Aug. 10, 2004, now abandoned.

(30) Foreign Application Priority Data

Mar. 15, 2004 (KR) .................... 10-2004-0017227
May 12, 2004 (KR) .................... 10-2004-0033549

(51) Int. Cl.
C23C 16/00 (2006.01)
C23F 1/00 (2006.01)
H01L 21/306 (2006.01)
H05B 31/26 (2006.01)

(52) U.S. Cl. ........... 156/345.48; 156/345.49; 118/723 I; 118/723 IR; 118/723 AN; 315/111.51

(58) Field of Classification Search ............... 118/723 I, 118/723 IR, 723 AN; 156/345.48, 345.49; 315/111.21, 111.41, 111.51
See application file for complete search history.

(56) References Cited

U.S. PATENT DOCUMENTS

| 5,565,738 | A | 10/1996 | Samukawa et al. |
| 5,838,111 | A | 11/1998 | Hayashi et al. |
| 5,900,699 | A * | 5/1999 | Samukawa et al. ...... 315/111.51 |
| 6,181,069 | B1 * | 1/2001 | Tonotani et al. ......... 315/111.51 |
| 2003/0010453 | A1 | 1/2003 | Tanaka et al. |
| 2003/0209324 | A1 * | 11/2003 | Fink ........................ 156/345.48 |
| 2004/0011466 | A1 * | 1/2004 | Matsumoto et al. ..... 156/345.48 |
| 2004/0026040 | A1 | 2/2004 | Kurihara et al. |
| 2004/0028837 | A1 | 2/2004 | Fink |
| 2004/0221814 | A1 * | 11/2004 | Yeom et al. ................. 118/723 I |

FOREIGN PATENT DOCUMENTS

JP 11-087096 * 3/1999

* cited by examiner

*Primary Examiner* — Rakesh Dhingra
(74) *Attorney, Agent, or Firm* — Foley & Lardner LLP

(57) ABSTRACT

A inductively coupled plasma apparatus includes reaction chamber in which a substrate is loaded, and a double comb type antenna structure including first linear antennas and second linear antennas respectively arranged horizontally to pass through the reaction chamber inside the reaction chamber. The first and second linear antenna are alternately aligned each other. First ends the first linear antennas are protruded out of the reaction chamber and coupled to each other so as to be coupled to a first induced RF power, and first ends of the second linear antennas are protruded out of the reaction chamber in opposition to the first ends of the first linear antennas and coupled to each other so as to be coupled to a second induced RF power. Plasma uniformity is improved and superior plasma uniformity is maintained by adjusting a distance between antennas according to a size of the substrate.

6 Claims, 15 Drawing Sheets

INDUCTIVELY COUPLED PLASMA APPARATUS

This application is a Continuation-in-part of Ser. No. 10/914,167 filed Aug. 10, 2004 (ABN), which claims priorities from Korean patent application 2004-17227 filed Mar. 15, 2004 and Korean patent application 2004-33549 filed May 12, 2004. The entire content of the aforementioned applications are incorporated herein by reference.

BACKGROUND

1. Technical Field

The present invention relates to an inductively coupled plasma apparatus.

2. Related Art

Generally, an inductively coupled plasma apparatus includes a spiral type antenna installed at an upper outer portion of a reaction chamber, in which a plasma etching process is carried out, by interposing dielectric material therebetween. In addition, RF induced power is applied to the spiral antenna in order to generate an electric field in the reaction chamber, thereby creating plasma. Such an inductively coupled plasma apparatus has a simple structure as compared with an ECR (electron cyclotron resonance) plasma apparatus or an HWEP (Helicon-wave exited plasma) apparatus, so the inductively coupled plasma apparatus may easily generate plasma over a large area. For this reason, the inductively coupled plasma apparatus has been applied to various fields and research into such inductively coupled plasma apparatuses has been continuously carried out.

FIG. 1a shows a structure of a chamber 300' of a conventional inductively coupled plasma apparatus. Hereinafter, the structure of the chamber 300' of the conventional inductively coupled plasma apparatus will be described.

An antenna source 100' is aligned at an uppermost part of the conventional inductively coupled plasma apparatus such that the antenna source 100' is exposed to an exterior. In addition, a dielectric member 200' is interposed between the antenna source 100' and the chamber 300' so as to insulate the antenna source 100' from the chamber 300' while maintaining a vacuum state. An object 400' to be etched is positioned at a bottom of the chamber 300'.

FIG. 1b shows a spiral antenna structure used for the chamber of the inductively coupled plasma apparatus.

However, such a spiral antenna structure shown in FIG. 1b may cause problems if a size and an area of the object 400' to be etched become enlarged.

Firstly, if the chamber has a large area, the size and thickness of the dielectric member for maintaining a vacuum state between the antenna source and the chamber become increased. Thus, a manufacturing cost is increased and efficiency is lowered because a distance between the antenna source and plasma becomes more distant.

In addition, since a length of the antenna source becomes long as the chamber has a large area, power loss may occur due to resistance of an antenna and etching uniformity may be deteriorated due to unevenness of plasma.

Furthermore, if a power supply capable of applying power of 13.56 MHz is used, a standing wave effect (two wave pulses having the same amplitude and frequency are traveling in opposition to each other and overlapped with each other so that the wave pulses look like standing waves) may occur at a half wavelength portion of the antenna source, so that it is impossible to further enlarge the size of the chamber.

SUMMARY

Accordingly, the present invention has been made to solve the above-mentioned problems occurring in the prior art, and a first feature of the present invention is to provide an inductively coupled plasma apparatus, which can be applied to a chamber having a large area, capable of improving uniformity of plasma.

A second feature of the present invention is to provide an inductively coupled plasma apparatus capable of generating plasma having superior uniformity by adjusting a distance between antennas according to a size of a substrate and preventing a standing wave effect by shortening a length of an antenna source.

A third feature of the present invention is to provide an inductively coupled plasma apparatus capable of preventing accident by maintaining a vacuum state even if a quartz protecting section is damaged by corrosive gas during an etching process and allowing a worker to easily exchange or repair the inductively coupled plasma apparatus.

In some embodiments, there is provided an inductively coupled plasma apparatus including a reaction chamber in which a substrate is loaded, and a double comb type antenna structure including a plurality of first linear antennas and a plurality of second linear antennas separately arranged horizontally to pass through the reaction chamber inside the reaction chamber. The first and second linear antenna are alternately aligned each other, first ends the first linear antennas are protruded out of the reaction chamber and coupled to each other so as to be coupled to a first induced RF power, and first ends of the second linear antennas are protruded out of the reaction chamber in opposition to the first ends of the first linear antennas and coupled to each other so as to be coupled to a second induced RF power.

Second ends the first linear antennas may be protruded out of the reaction chamber in opposition to the first ends of the first linear antennas and are grounded, and second ends the second linear antennas may be protruded out of the reaction chamber in opposition to the first ends of the second linear antennas and are grounded.

The first and second linear antenna respectively may have antenna rods that are alternatively aligned.

The inductively coupled plasma apparatus may further include magnets installed inside the reaction chamber to be arranged above the antenna rods, each of the magnets may include a permanent magnet having an N-pole and a permanent magnet having an S-pole.

The second linear antennas may be electrically separated from the first linear antennas.

The inductively coupled plasma apparatus may further include an assembling frame formed at both longitudinal ends thereof with a plurality of perforated holes and having a recess therein.

The inductively coupled plasma apparatus may further include a quartz window for covering the recess of the assembling frame.

The assembling frame may freely move lengthwise along the reaction chamber.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Figure 1A:
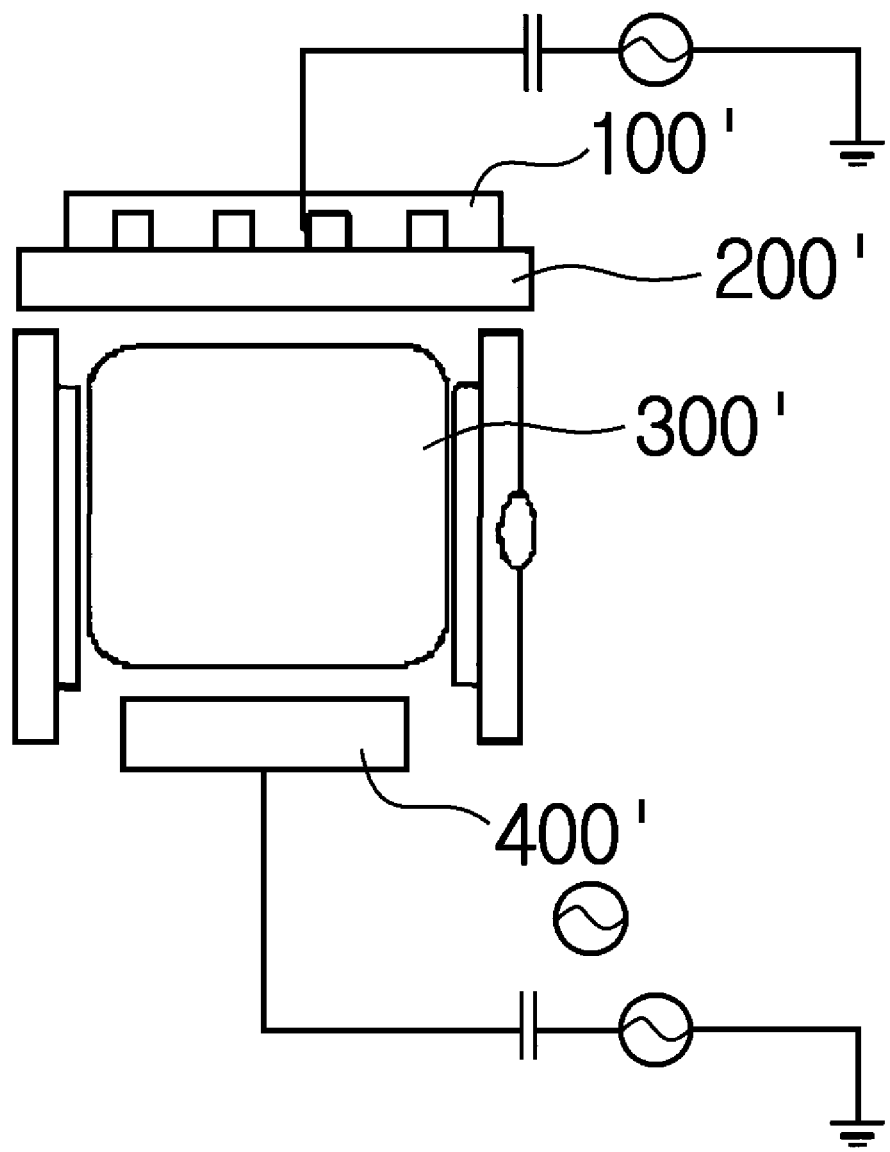
FIG. 1a is a view showing a structure of a conventional plasma apparatus.
Figure 1B:
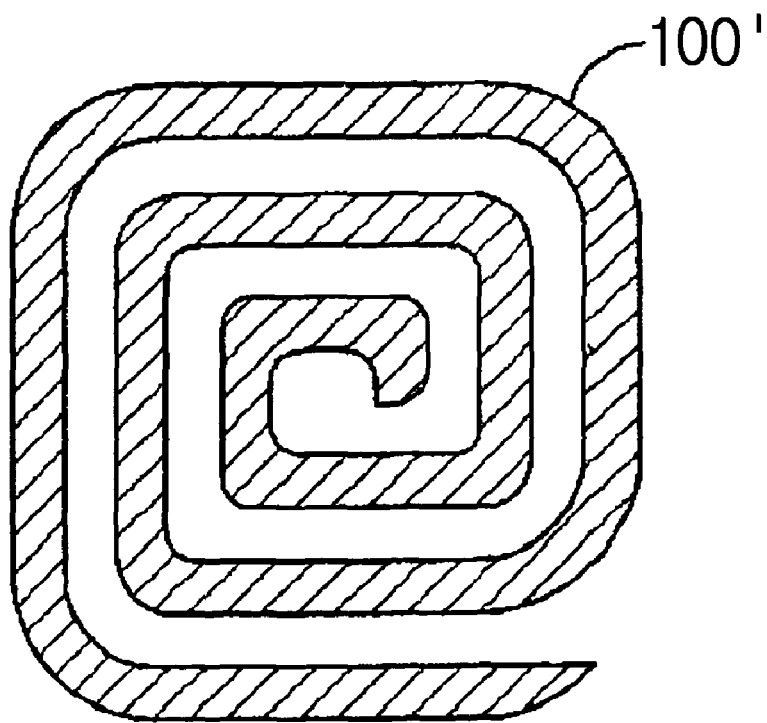
FIG. 1b is a schematic view showing a structure of a conventional ICP source.

Hereinafter, preferred embodiments of the present invention will be described with reference to the accompanying drawings. In the following description and drawings, the same reference numerals are used to designate the same or similar components, and so repetition of the description on the same or similar components will be omitted.

Embodiment 1

Figure 2:
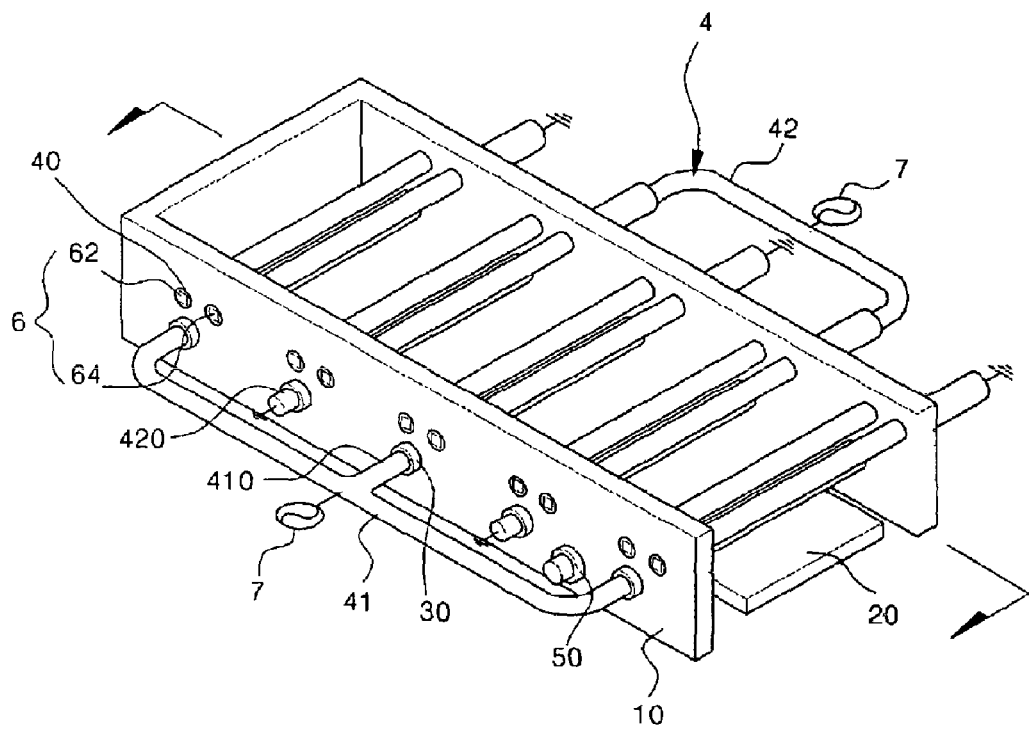
FIG. 2 is a perspective view showing an inductively coupled plasma apparatus according to a first embodiment of the present invention.
Figure 3:
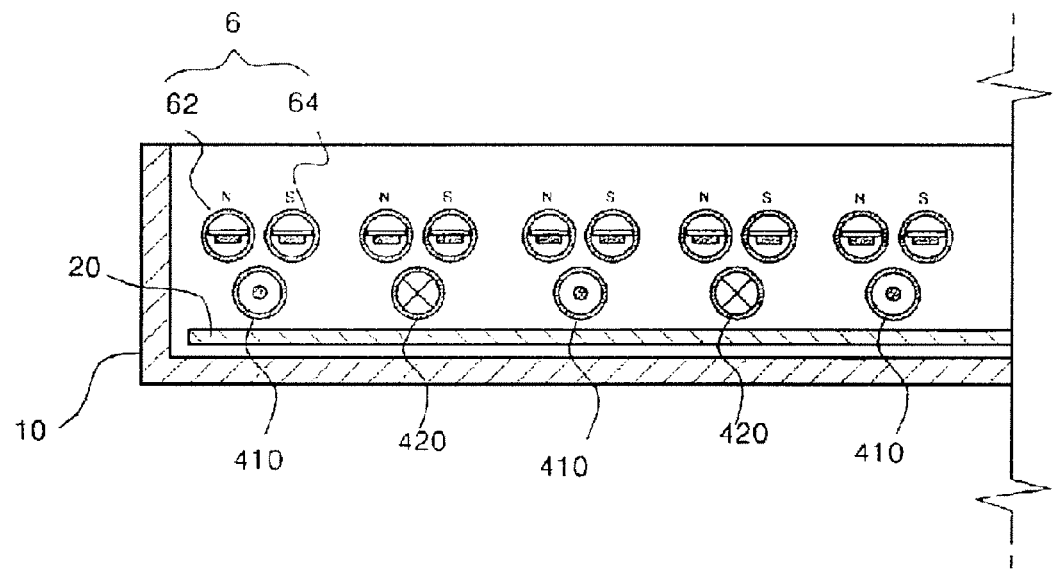
FIG. 3 is a cross-sectional view of FIG. 2.
Figure 4A:
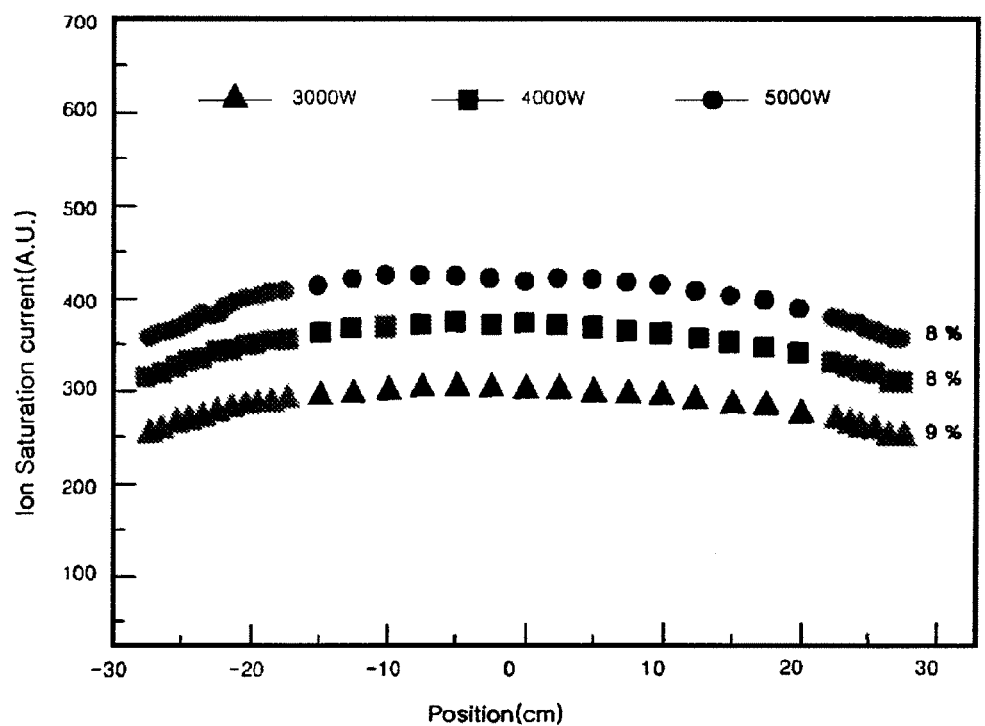
FIG. 4a is a graph representing plasma uniformity measured by using a Langmuir probe when a magnetic field is not applied.
Figure 4B:
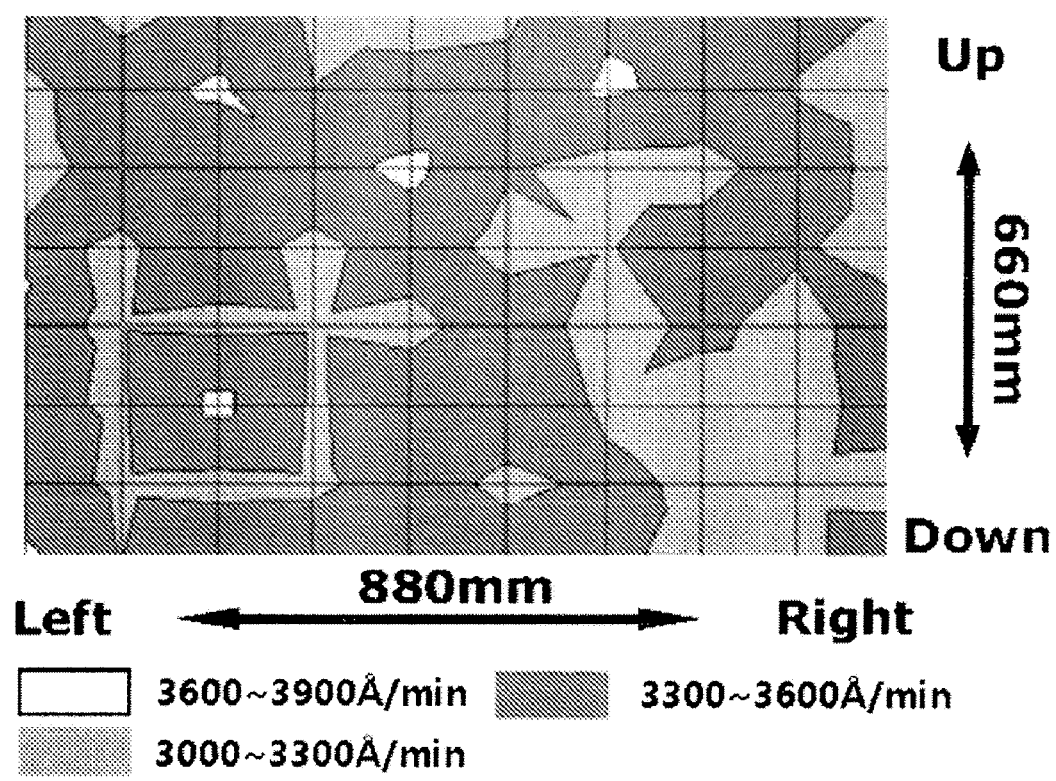
FIG. 4b is a graph showing the etch rate of photoresist using $O^2$ plasma when a magnetic field is not applied.
Figure 4C:
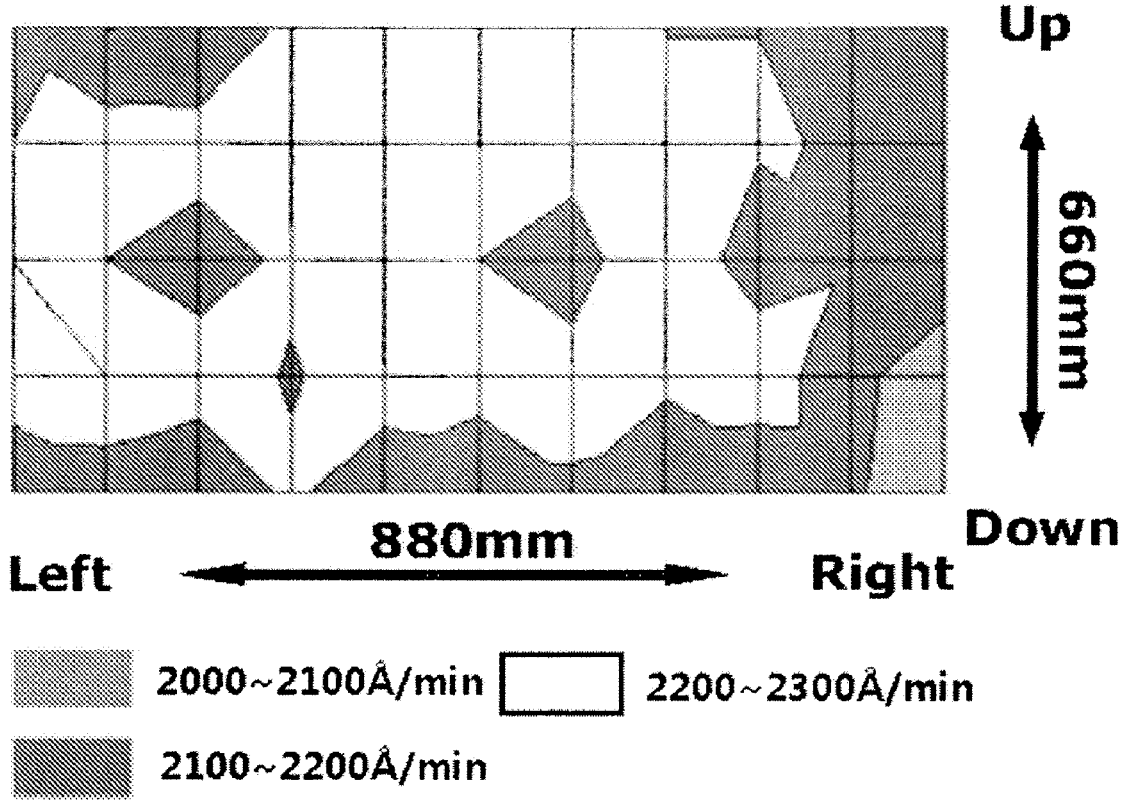
FIG. 4c is a graph showing the etch rate of Si $O^2$ film using $SF_6$ plasma when a magnetic field is not applied.
Figure 5:
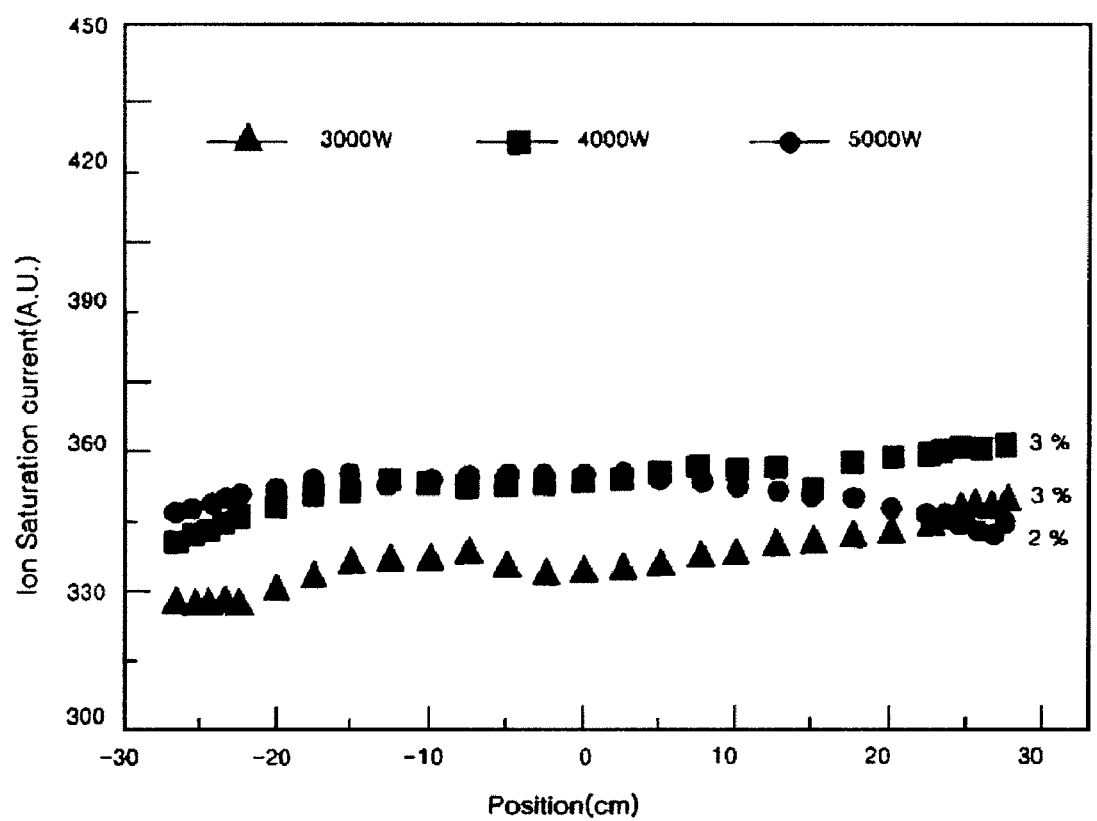
FIG. 5 is a graph representing plasma uniformity measured by using a Langmuir probe when a magnetic field is applied.
Figure 6:
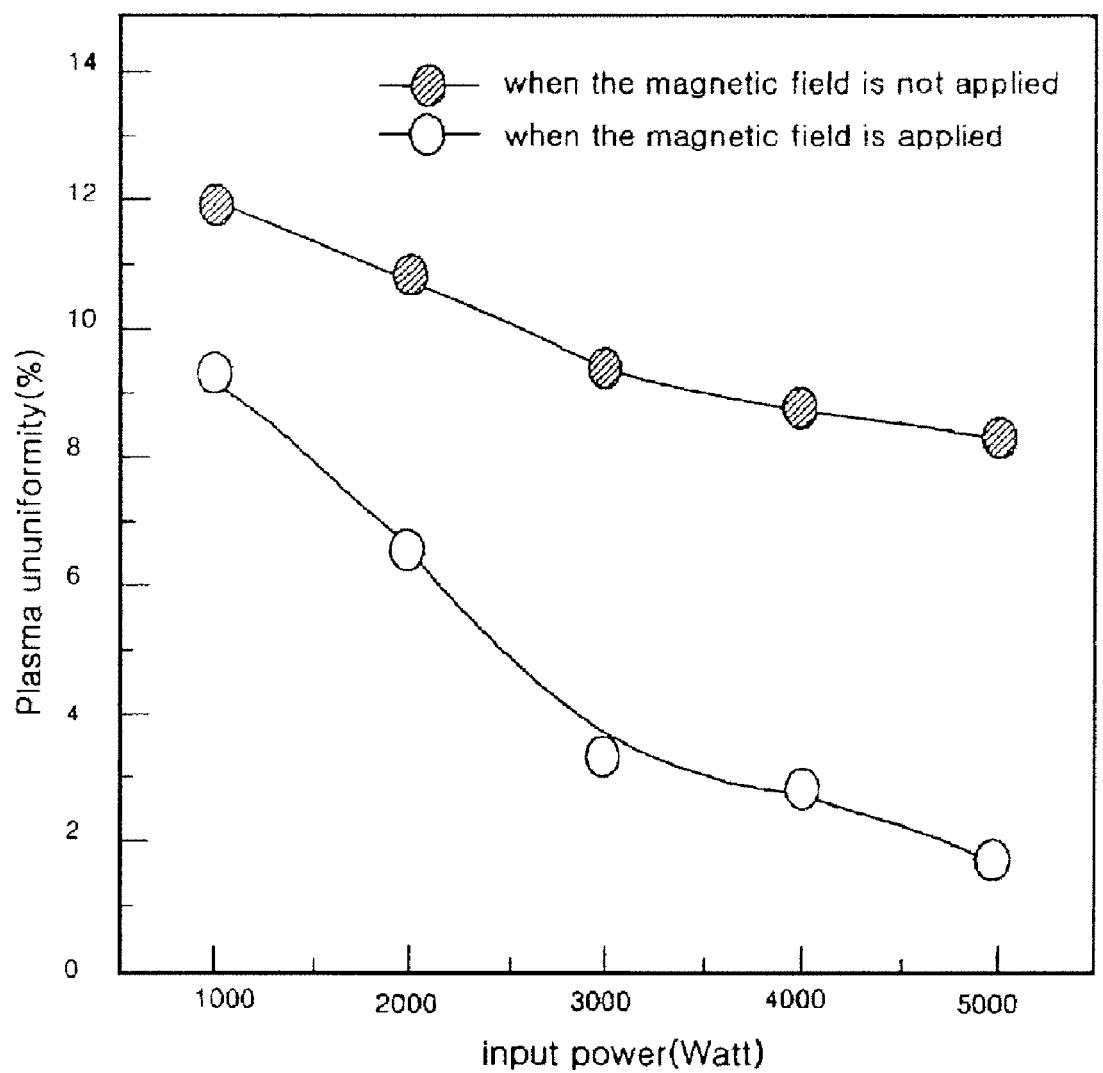
FIG. 6 is a graph representing plasma uniformity measured as a function of input power, when a magnetic field is applied and when it is not applied.

FIGS. 2 to 6 are views relating to an inductively coupled plasma apparatus according to a first embodiment of the present invention. FIG. 2 is a perspective view showing the inductively coupled plasma apparatus using a magnetic field according to the first embodiment of the present invention, FIG. 3 is a cross-sectional view of FIG. 2, FIG. 4a is a graph representing plasma uniformity measured by using a Langmuir probe when a magnetic field is not applied, FIG. 4b is a graph showing the etch rate of photoresist using $O^2$ plasma when a magnetic field is not applied, FIG. 4c is a graph showing the etch rate of Si $O^2$ film using $SF_6$ plasma when a magnetic field is not applied, FIG. 5 is a graph representing plasma uniformity measured by using a Langmuir probe when a magnetic field is applied, and FIG. 6 is a graph representing plasma uniformity measured as a function of input power, when a magnetic field is applied and when the magnetic field is not applied.

Referring to FIG. 2, a stage 20 is installed at a lower portion of a reaction chamber 10 so as to load a substrate (not shown) thereon when an etching process or a deposition process is carried out with respect to the substrate. The stage 20 is preferably moved up and down.

The reaction chamber 10 is provided at a bottom or a sidewall thereof with an exhaust line connected to a vacuum pump (not shown).

A bias power applying section is connected to the stage 20 in order to apply bias power to the stage 20. In addition, a bias voltage measurement unit (not shown) is installed on the stage 20 in order to measure bias voltage applied to the stage 20.

Meanwhile, an inner lower portion of the reaction chamber 10 is a plasma source region for generating plasma, in which an antenna source 4 is installed. The antenna source 4 includes antenna rods 410 and 420 alternately aligned in a horizontal direction adjacent to and in parallel to each other while forming a predetermined distance therebetween.

As shown in FIG. 3, the antenna source 4 includes a first comb-type antenna 41 (hereinafter, simply referred to as a first antenna) having a plurality of antenna rods 410, which are connected to each other in a row, and a second comb-type antenna 42 (hereinafter, simply referred to as a second antenna) having a structure identical to a structure of the first antenna 41. The first antenna 41 is aligned in opposition to the second antenna 42 in such a manner that the antenna rods 410 and 420 are alternately aligned in parallel to each other. Herein, first sides of the first and second antennas 41 and 42 are connected to an RF induced power section 7 and second sides of the first and second antennas 41 and 42 are grounded.

According to the first embodiment of the present invention, the first antenna 41 has an m number of antenna rods 410 and the second antenna 42 has an m−1 or m number of antenna rods 420 arrayed in such a manner that each antenna rod 420 of the second antenna 42 is inserted between antenna rods 410 of the first antenna 41.

In addition, the antenna rods 410 and 420 are inserted into an antenna protecting pipe 30 in the reaction chamber 10.

The antenna protecting pipe 30 includes a quartz pipe having superior endurance against sputtering and the antenna rods 410 and 420 are made from copper, stainless steel, silver, or aluminum.

First ends of the antenna rods 410 and 420 are grounded and second ends of the antenna rods 410 and 420 are connected to the RF induced power section 7 for the purpose of inductive discharge.

As shown in FIG. 3, magnets 6 may be aligned inside the reaction chamber 10 above the antenna rods 410 and 420 of the first and second antennas 41 and 42. Each of the magnets 6 includes a pair of permanent magnets 62 and 64 having an N-pole and an S-pole, respectively. Since the magnets 6 are aligned above the antenna rods 410 and 420 of the first and second antennas 41 and 42, a magnetic field is applied to the antenna source 4.

In addition, since the permanent magnets 62 and 64 having the N-pole and S-pole are alternately aligned, a direction of the magnetic field created by lines of magnetic force formed between the permanent magnets 62 and 64 is perpendicular to a direction of the electric field so that electrons subject to the magnetic field and the electric field may move with a helical motion.

Such a situation signifies that moving routes of electrons are increased, so that probability of collision between electrons and neutrons may increase, that is, a collision frequency may increase. As the probability of collision between electrons and neutrons is increased due to the helical motion of the electrons caused by the magnetic field, ion density becomes high and mobility of electrons becomes low, thereby reducing electron loss.

The permanent magnets 62 and 64 are surrounded by a magnet protecting pipe 40 made from material having superior resistant property against sputtering, such as quartz. In order to measure plasma characteristics of the inductively coupled plasma apparatus having the above construction, a Langmuir probe 50 is installed at a lower portion of the antenna source 4 in such a manner that the Langmuir probe 50 protrudes towards a center of the reaction chamber 10 from a sidewall of the reaction chamber 10.

The Langmuir probe 50 used in the present invention is available from Hiden Analytical Inc. of Great Britain. The Langmuir probe 50 measures plasma characteristics, such as plasma density and plasma uniformity. In addition, Ar gas is injected into the reaction chamber 10 to allow a worker to monitor the plasma characteristics.

According to the first embodiment of the present invention, the reaction chamber 10 has a hexahedral shape, the antenna source 4 is installed in the reaction chamber 10 in such a manner that the first and second antennas 41 and 42 are alternately aligned in the reaction chamber 10 and induced power is applied to the first and second antennas 41 and 42, respectively, thereby generating plasma.

Meanwhile, according to the present invention, RF power passes through a path corresponding to a transverse length of the reaction chamber, the standing wave effect is not created by the antenna source 4.

The above-mentioned antenna source 4 can effectively generate plasma over a large discharge area.

FIG. 4a is a graph representing plasma uniformity measured by using the Langmuir probe when the magnetic field is not applied, FIG. 4b is a graph showing the etch rate of photoresist using $O^2$ plasma when a magnetic field is not applied, FIG. 4c is a graph showing the etch rate of $SiO^2$ film using $SF_6$ plasma when a magnetic field is not applied, and FIG. 5 is a graph representing plasma uniformity measured by using the Langmuir probe when the magnetic field is applied.

That is, as shown in FIG. 4a, if the magnetic field is not applied to the antenna source, non-uniformity of 8%, 5% and 9% is represented according to power of 3000 Watt, 4000 Watt, and 5000 Watt.

The operation condition of the experiment in FIG. 4b is such that the operation pressure is 15 mTorr of O2 gas, power is 5000 Watt, RF frequency is about 13.56 MHz, bias voltage of the substrate is −60 voltage. As shown in FIG. 4b, there are three regions respectively having the etch rate between 3600~3900 Å/min, 3300~3600 Å/min, 3000~3300 Å/min. Thus, the ununiformity of the etch rate within the substrate was about 7%.

The operation condition of the experiment in FIG. 4c is such that the operation pressure is 15 mTorr of $SF_6$ gas, power is 5000 Watt, RF frequency is about 13.56 MHz, bias voltage of the substrate is −34 voltage. As shown in FIG. 4c, there are four regions respectively having the etch rate between 2000~2100 Å/min, 2100~2200 Å/min and 2200~2300 Å/min. Thus, the ununiformity of the etch rate within the substrate was lower than 5%.

Therefore, the inductively coupled plasma apparatus without the magnet can also provide satisfactory uniformity of plasma, and can be applied to a chamber having a large area.

As shown in FIG. 5, if the magnetic field is applied to the antenna source, relatively low non-uniformity of 3%, 2% and 3% is represented according to power of 3000 Watt, 4000 Watt, and 5000 Watt, which signifies that plasma uniformity is improved.

Therefore, by applying the magnetic field to the antenna source according to the present invention, plasma uniformity, which is a very important factor for the inductively coupled plasma apparatus, can be improved over the large area.

FIG. 6 is a graph representing plasma uniformity measured as a function of input power, when the magnetic field is applied or is not applied. As is understood from FIG. 6, non-uniformity of plasma as a function of input power is reduced when the magnetic field is applied to the antenna source than the magnetic field is not applied to the antenna source. The result shown in FIG. 6 represents that plasma uniformity is improved when the magnetic field is applied to the antenna source. However, the plasma uniformity is also satisfactory for a chamber having a large area even when the magnetic field is not applied to the antenna source as shown in FIGS. 4b and 4c.

Embodiment 2

FIGS. 7 to 11 show a structure of an inductively coupled plasma apparatus according to a second embodiment of the present invention.

Figure 7:
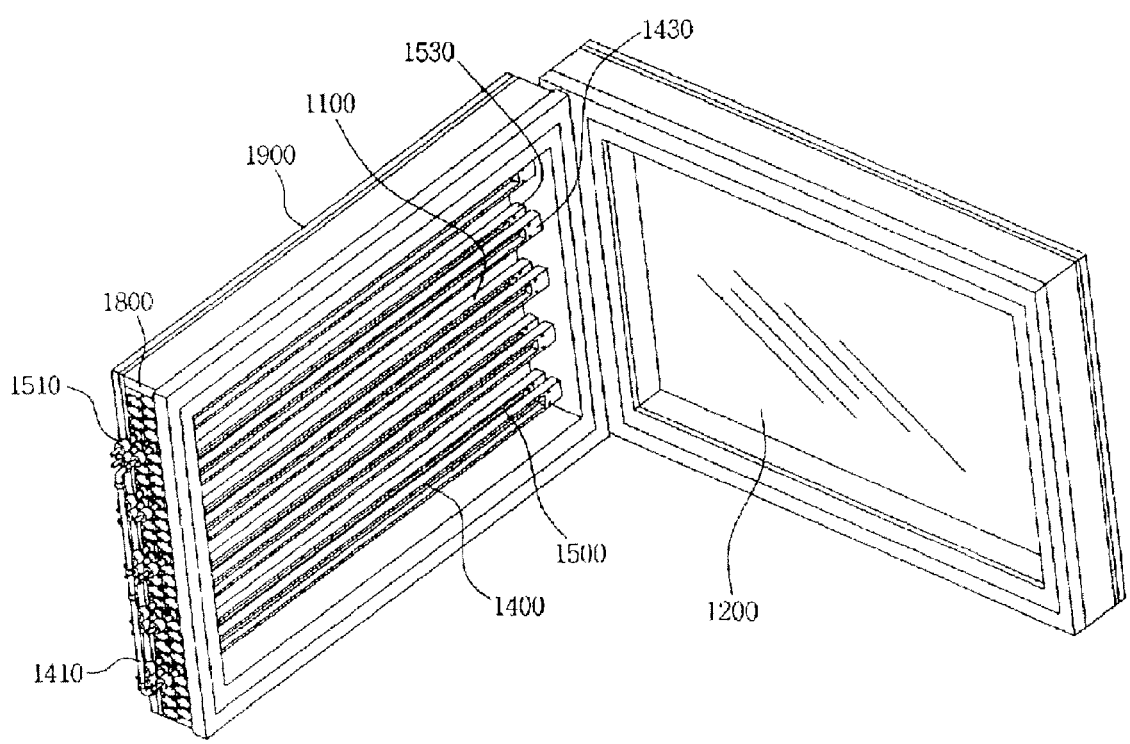
FIG. 7 is a perspective view showing a module-type inductively coupled plasma apparatus according to a second embodiment of the present invention.
Figure 8:
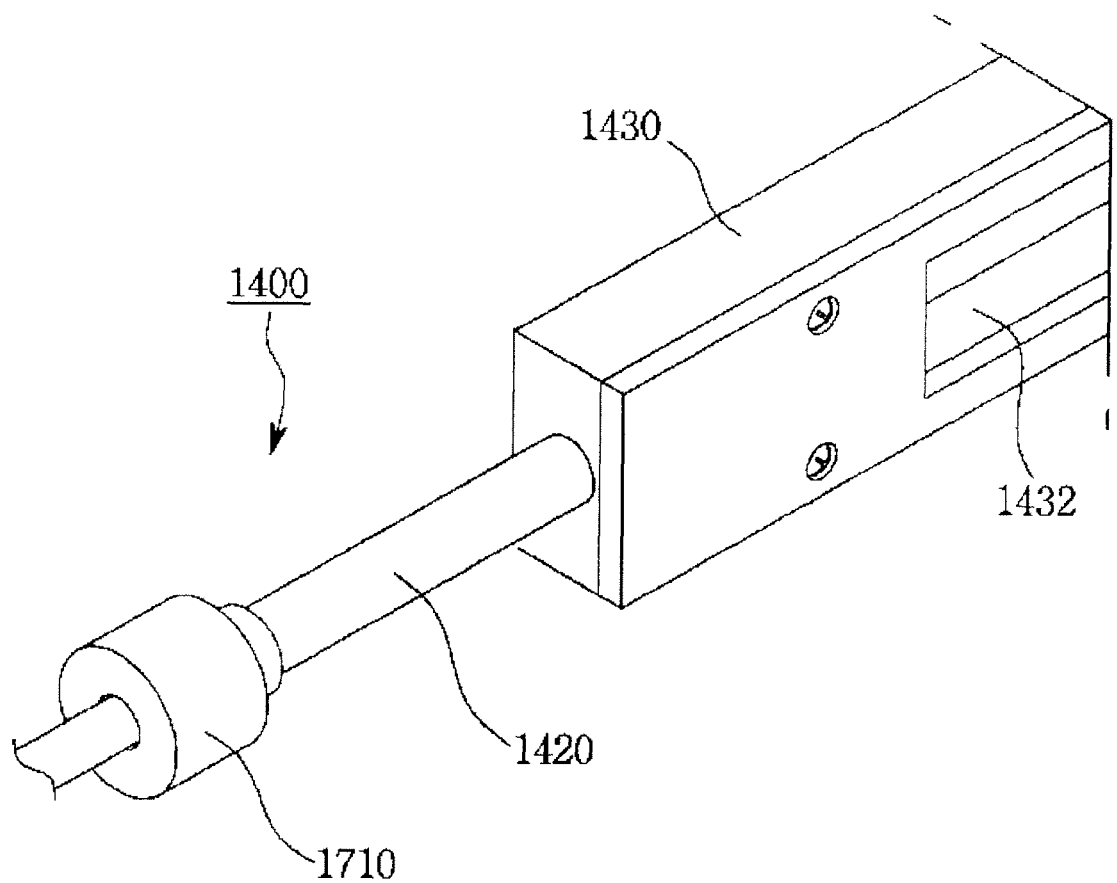
FIG. 8 is a perspective view showing an antenna assembly shown in FIG. 7.

FIG. 7 is a perspective view showing a structure of the inductively coupled plasma apparatus according to the second embodiment of the present invention, and FIGS. 8 to 11 represent an antenna assembly shown in FIG. 7. A magnet assembly has a structure identical to a structure of an antenna assembly, except that the magnet assembly includes a magnet instead of an antenna.

Referring to FIG. 7, a stage 1200 is installed at a lower portion of a reaction chamber 1100 so as to load a substrate (not shown) thereon when an etching process or a deposition process is carried out with respect to the substrate. The stage 1200 is preferably moved up and down. In addition, as shown in FIG. 7, the reaction chamber 1100 is divided into an antenna source-magnet part and a bottom part on which the substrate is placed in such a manner that the antenna source-magnet part and the bottom part are assembled with each other only when the etching process or the deposition process is carried out and separated from each other in normal times.

In addition, bias power applying section is connected to the stage 1200 in order to apply bias power to the stage 1200. In addition, a bias voltage measurement unit (not shown) can be installed on the stage 1200 in order to measure bias voltage applied to the stage 1200.

Meanwhile, an inner lower portion of a cover 1900 of the reaction chamber 1100 is a plasma source region for generating plasma, in which antenna sources are installed. Each of the antenna sources includes antenna assemblies 1400 aligned in a horizontal direction adjacent to and in parallel to each other while forming a predetermined distance therebetween.

Figure 9:
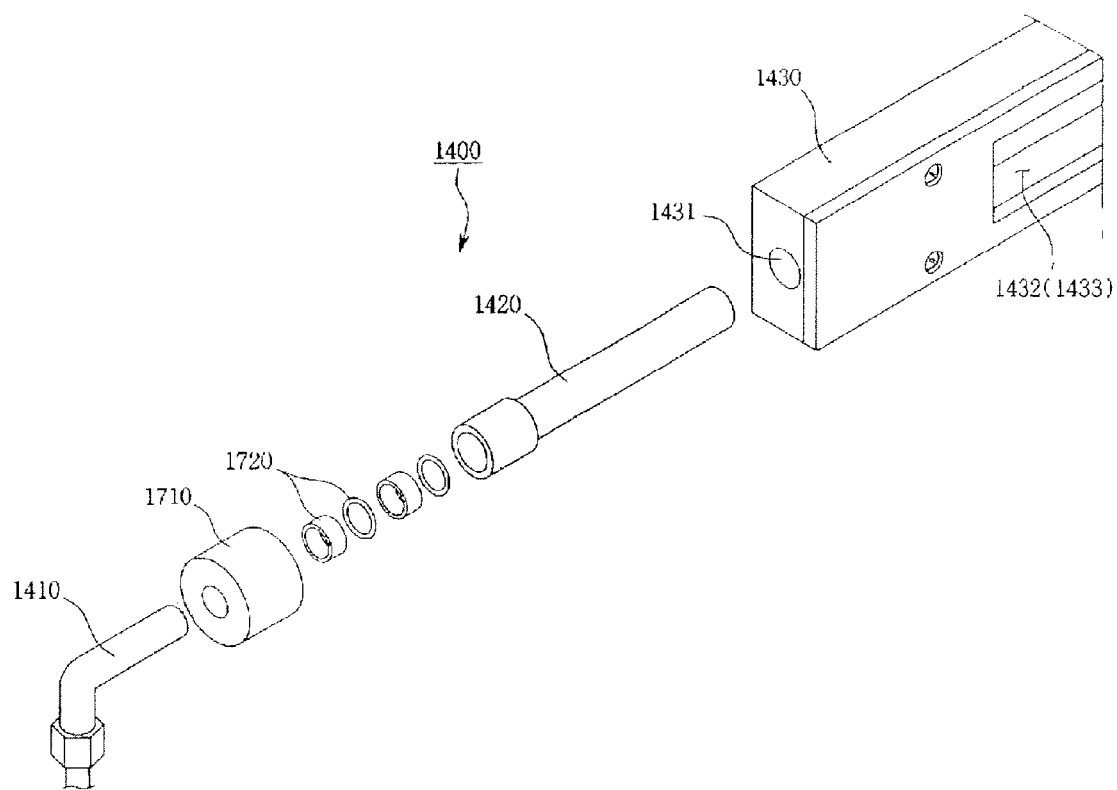
FIG. 9 is an exploded perspective view showing an antenna assembly shown in FIG. 7.
Figure 10:
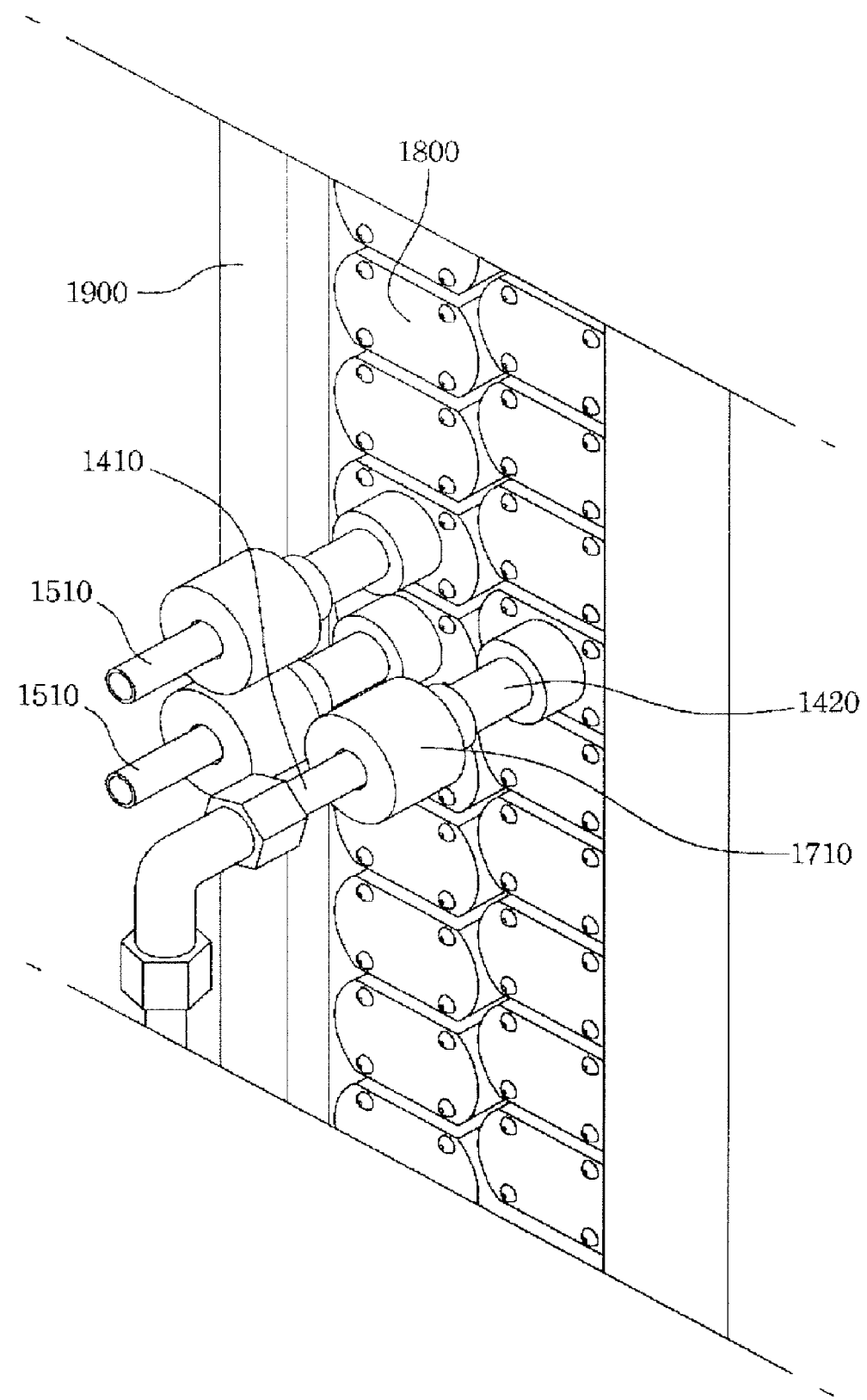
FIG. 10 is a perspective view showing an external structure of an antenna assembly and a magnet assembly shown in FIG. 7.

As shown in FIG. 9, the antenna source includes a plurality of antenna assemblies 1400 connected to each other in a row. Two comb-type antenna sources are alternately aligned in opposition to each other. Thus, if one antenna source has an m number of antenna assemblies and the other antenna source coupled to one antenna source has an m−1 number of antenna assemblies, each antenna assembly of one antenna source is inserted between antenna assemblies of the other antenna source.

It is also possible to allow two antenna sources to have the same number of antenna assemblies while placing the antenna assemblies in alternated alignment.

A first side of each antenna source is connected to an RF induced power section 1700 and a second side of each antenna source is grounded.

In addition, magnet assemblies 1500 are aligned at both sides of the antenna assembly 1400.

An antenna rod 1410 is assembled into an assembling frame 1800 of the cover 1900 of the reaction chamber 110 by interposing an assembling case 1430 made from Teflon therebetween. In detail, as shown in FIGS. 8 to 11, the antenna rod 1410 is inserted into a perforated hole 1431 formed at both longitudinal ends of the assembling case 1430 in such a manner that the antenna rod 1410 is accommodated in a recess 1432 formed in the assembling case 1430 lengthwise along the assembling case 1430.

Figure 11:
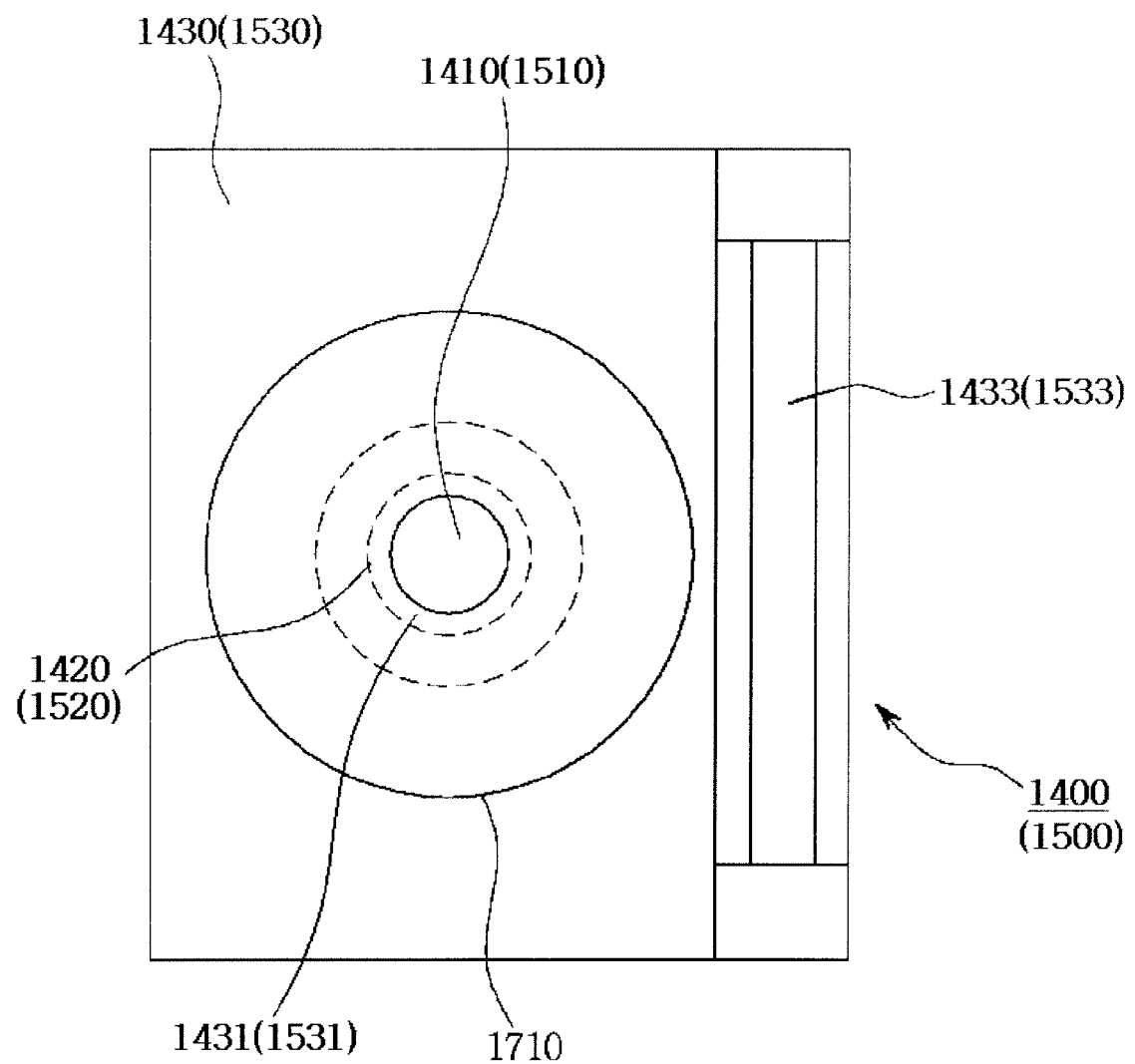
FIG. 11 is a front sectional view showing an antenna assembly or a magnet assembly.

In addition, the antenna rod 1410 is surrounded by a resin pipe 1420 such that a vacuum space is formed therebetween. As shown in FIG. 9 and FIG. 11, a vacuum state of the vacuum space may be maintained by installing a connector 1710 and an C-ring 1720 between the antenna rod 1410 and the resin pipe 1420 and between a magnet 1510 and a resin pipe 1520, respectively, from an exterior of the reaction chamber 1100.

The resin pipes 1420 and 1520 are made from Teflon material, such as PTFE (polytetrafluoroethylene), PFA (perfluoroalkoxy), FEP (fluoroethylenepropylene), or PVDF (polyvinyulidene fluoride).

In addition, the recess 1432 of the assembling case 1430 is covered with a quartz window 1433. The quartz window 1433 is aligned in opposition to the stage 1200 in order to protect the antenna rod 1410 against plasma.

Meanwhile, the structure of the magnet assembly 1500 is identical to the structure of the antenna assembly 1400.

That is, the magnet assembly 1500 includes an assembling case 1530 formed at both longitudinal ends thereof with a perforated hole 1531 and having a recess 1532 formed lengthwise along the magnet assembly 1500, a quartz window 1533 covering the recess 1532 of the assembling case 1530, a magnet 1510 inserted into the perforated hole of the assembling case 1530, and a resin pipe 1520 installed around the magnet 1510 such that a vacuum space is formed therebetween.

In addition, as shown in FIG. 7, the magnet assembly 1500 including an N-pole permanent magnet 1510 and an S-pole permanent magnet 1520 is aligned above the antenna assembly 1400. That is, since the magnet assembly 1500 is positioned above the antenna assembly 1400, the magnetic field is applied to the antenna source.

In addition, since the N-pole permanent magnet 1510 and the S-pole permanent magnet 1520 are alternately aligned, a direction of the magnetic field created by lines of magnetic force formed between the permanent magnets 1510 and 1520 is perpendicular to a direction of the electric field so that electrons subject to the magnetic field and the electric field may move with a helical motion.

Such a situation signifies that moving routes of electrons are increased, so that probability of collision between electrons and neutrons may increase, that is, a collision frequency may increase. As the probability of collision between electrons and neutrons is increased due to the helical motion of the electrons caused by the magnetic field, ion density becomes high and mobility of electrons becomes low, thereby reducing electron loss.

In addition, since the quartz window is additionally provided while installing the resin pipe made from Teflon between the quartz window and the antenna rod, the vacuum state of the vacuum space may be continuously maintained by means of the resin pipe even if the quartz window is damaged by corrosive gas, so the inductively coupled plasma apparatus can continuously operate without deteriorating performance thereof.

Meanwhile, the assembling frame 1800 having the antenna assembly 1400 and the magnet assembly 1500 can be installed such that the assembling frame 1800 freely moves lengthwise along the cover 1900 or the reaction chamber 1100. In this case, it is possible to exchange only the assembling frame 1800 including the antenna assembly 1400 and the magnet assembly 1500 with new one, so the reconstruction of the assembling frame 1800 can be easily achieved.

Embodiment 3

Figure 12A:
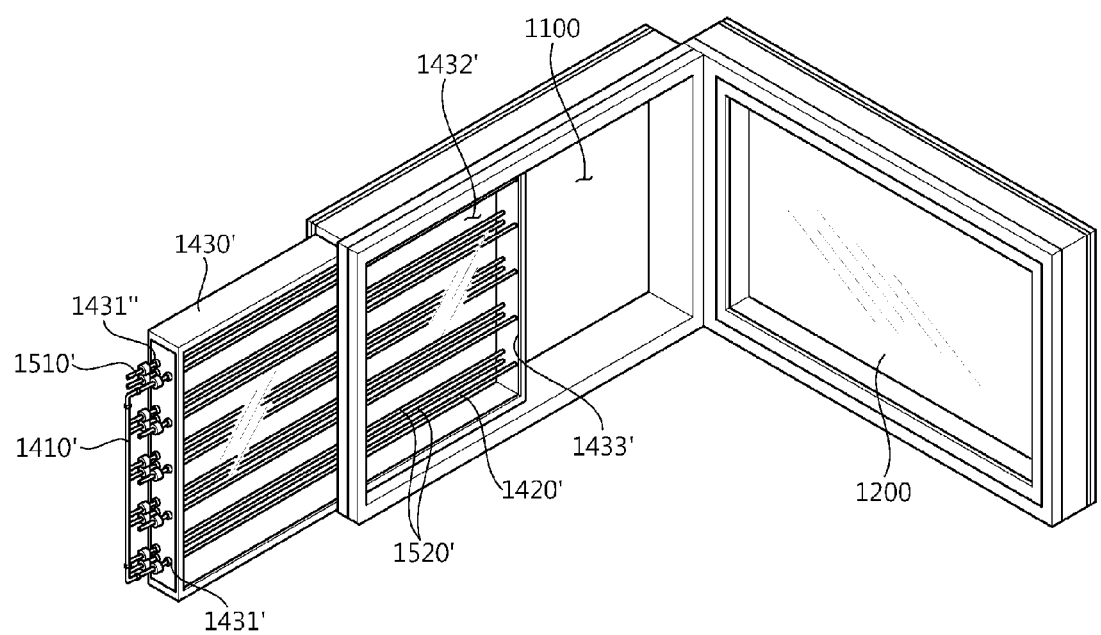
FIG. 12a is a developed perspective view showing a module-type inductively coupled plasma apparatus according to a third embodiment of the present invention.
Figure 12B:
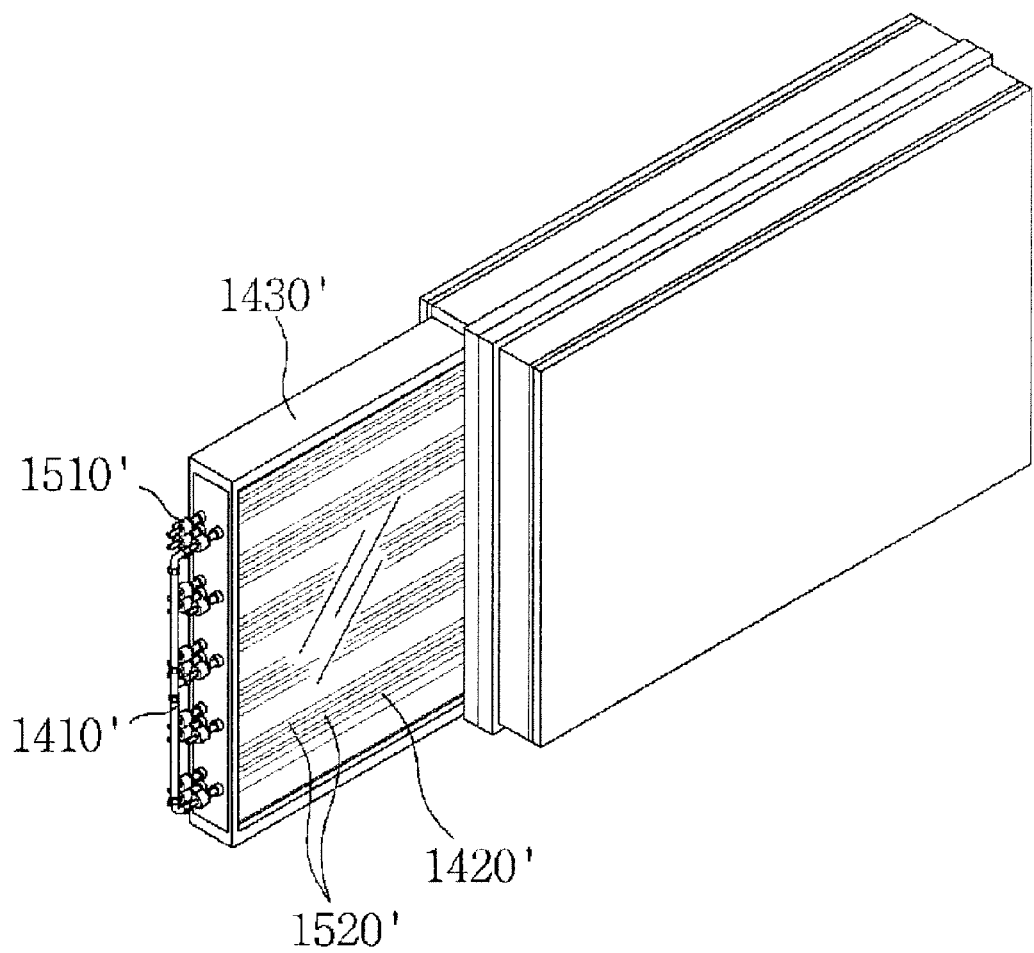
FIG. 12b is an assembled perspective view showing a module-type inductively coupled plasma apparatus according to a third embodiment of the present invention.
Figure 13:
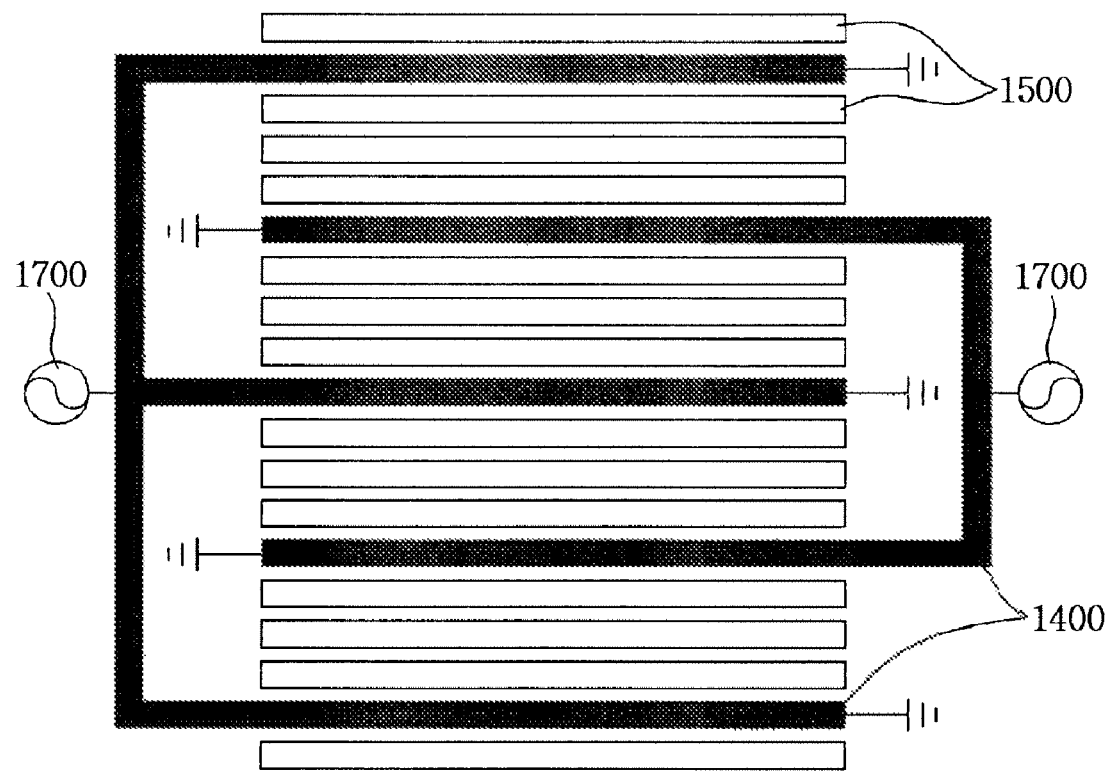
FIG. 13 is a plan view showing an alignment of an antenna source and a magnet.

FIGS. 12*a* and 12*b* are views showing a structure of an inductively coupled plasma apparatus according to a third embodiment of the present invention.

As shown in FIGS. 12*a* and 12*b*, the inductively coupled plasma apparatus according to the third embodiment of the present invention is identical to the inductively coupled plasma apparatus according to the second embodiment of the present invention. That is, the inductively coupled plasma apparatus according to the third embodiment of the present invention includes a reaction chamber 1100 having a stage 1200 for loading a substrate thereon when an etching process or a deposition process is carried out, a plurality of antenna rods 1410' aligned in parallel to each other in the reaction chamber 1100 and having first ends connected to a power source 1700 and second ends which are grounded, and magnets 1510' aligned at both sides of the antenna rods 1410'.

However, according to the present embodiment, an assembling frame 1430' is formed at longitudinal ends thereof with a plurality of perforated holes 1431' and 1431", and formed at an inner portion thereof with a recess 1432' having an area sufficient for covering the stage 1200.

In addition, the recess 1432' of the assembling frame 1430' is covered with a quartz window 1433'.

In this state, the antenna rod 1410' is inserted into the perforated hole 1431' of the assembling frame 1430' assembled with the reaction chamber 1100'. A resin pipe 1520' or 1420' is installed around the magnet 1510' such that a vacuum space is formed therebetween.

In addition, as shown in FIGS. 12*a* and 12*b*, the assembling frame 1430' can be freely moved lengthwise along the reaction chamber 1100', so it is possible to exchange only the assembling frame 1430' including the antenna rod 1410' and the magnet 1510' with new one, so the reconstruction and repair for the assembling frame 1430' can be easily achieved.

As described above, the inductively coupled plasma apparatus according to the present invention has the following advantages.

First, plasma uniformity can be improved because plasma is generated while applying a magnetic filed to an antenna source having antennas aligned in a row.

Second, it is possible to generate plasma having superior uniformity by adjusting a distance between antennas according to a size of a substrate.

Third, since the quartz window is additionally provided while installing the resin pipe made from Teflon between the quartz window and the antenna rod, the vacuum state of the vacuum space may be continuously maintained by means of the resin pipe even if the quartz window is damaged by corrosive gas, so the inductively coupled plasma apparatus can continuously operate without deteriorating performance thereof.

Fourth, since assembling frame having the antenna assembly and the magnet assembly can be fabricated as a module or with a drawer structure, the assembling frame can be easily exchanged and repairing work thereof can be easily achieved.

Although the inductively coupled plasma apparatuses in FIGS. 3, 7, 10, 11, 12a, 12b and 13 include magnets aligned inside the reaction chamber above the antenna rods, the magnets may be removed form the inductively coupled plasma apparatus according to another example embodiments of the present invention. The inductively coupled plasma apparatus without the magnet can also be applied to a chamber having a large area so as to enhance uniformity of plasma.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An inductively coupled plasma processing apparatus for a large area processing, the inductively coupled plasma processing apparatus comprising:
   a reaction chamber in which a substrate is loaded;
   a double comb type antenna structure including a plurality of first linear antennas and a plurality of second linear antennas separately arranged horizontally to pass through the reaction chamber inside the reaction chamber,
   wherein the first and second linear antenna are alternately aligned with each other, first ends of the first linear antennas are protruded out of the reaction chamber and coupled to each other so as to be coupled to a first induced RF power, and first ends of the second linear antennas are protruded out of the reaction chamber in opposition to the first ends of the first linear antennas and coupled to each other so as to be coupled to a second induced RF power,
   wherein second ends of the first linear antennas are protruded out of the reaction chamber in opposition to the first ends of the first linear antennas and are grounded, and second ends of the second linear antennas are protruded out of the reaction chamber in opposition to the first ends of the second linear antennas and are grounded,
   and wherein the first linear antennas has a plurality of first antenna rods which are connected to each other, the second linear antennas has a plurality of second antenna rods which are connected to each other, and each of the second antenna rods of the second linear antenna is inserted between the first rods of the first linear antenna.

2. The inductively coupled plasma apparatus as claimed in claim 1, wherein the first and second linear antenna respectively have first antenna rods and second antenna rods that are alternatively aligned.

3. The inductively coupled plasma apparatus as claimed in claim 2, further including magnets installed inside the reaction chamber to be arranged above the antenna rods, each of the magnets including a permanent magnet having an N-pole and a permanent magnet having an S-pole.

4. The inductively coupled plasma apparatus as claimed in claim 1, further including an assembling frame formed at both longitudinal ends thereof with a plurality of perforated holes and having a recess therein.

5. The inductively coupled plasma apparatus as claimed in claim 4, further including a quartz window for covering the recess of the assembling frame.

6. The inductively coupled plasma apparatus as claimed in claim 4, wherein the assembling frame freely moves lengthwise along the reaction chamber.

* * * * *